United States Patent
Wang et al.

(10) Patent No.: US 9,373,416 B2
(45) Date of Patent: Jun. 21, 2016

(54) METHOD AND SYSTEM FOR TESTING A MEMORY

(71) Applicant: NVIDIA Corporation, Santa Clara, CA (US)

(72) Inventors: Fei Wang, Guangzhou (CN); Yu Zhao, Shenzhen (CN); Xiang Sun, Shenzhen (CN)

(73) Assignee: NVIDIA Corporation, Santa Clara, CA (US)

( * ) Notice: Subject to any disclaimer, the term of this patent is extended or adjusted under 35 U.S.C. 154(b) by 263 days.

(21) Appl. No.: 14/066,602

(22) Filed: Oct. 29, 2013

(65) Prior Publication Data

US 2015/0058678 A1 Feb. 26, 2015

(30) Foreign Application Priority Data

Aug. 23, 2013 (CN) .......................... 2013 1 0372870

(51) Int. Cl.
*G11C 29/00* (2006.01)
*G11C 29/04* (2006.01)
*G11C 29/08* (2006.01)
*G06F 11/00* (2006.01)
*G11C 29/10* (2006.01)

(52) U.S. Cl.
CPC ................ *G11C 29/08* (2013.01); *G11C 29/10* (2013.01)

(58) Field of Classification Search
None
See application file for complete search history.

(56) References Cited

U.S. PATENT DOCUMENTS

| 6,345,372 | B1 * | 2/2002 | Dieckmann | G11C 29/10 714/25 |
| 7,085,973 | B1 * | 8/2006 | Yin | G11C 29/025 714/718 |
| 8,315,115 | B2 * | 11/2012 | Bomholt | G11C 29/02 365/200 |
| 8,713,379 | B2 * | 4/2014 | Takefman | H03M 13/05 714/701 |
| 8,793,540 | B2 * | 7/2014 | Kawakami | G11C 29/56004 714/27 |
| 2009/0296505 | A1 * | 12/2009 | Shibazaki | G11C 29/20 365/201 |

* cited by examiner

*Primary Examiner* — Justin R Knapp
(74) *Attorney, Agent, or Firm* — Zilka-Kotab, PC

(57) ABSTRACT

A method and system for testing a memory is provided in the present invention. The method includes the following steps. Each of at least one address bit to be tested of the memory is set to a fixed value. Current test data is written into memory unit(s) of the memory which the set address bit(s) correspond(s) to. Current read back data is read from the memory unit(s) which the set address bit(s) correspond(s) to. The current test data is compared with the current read back data. It is judged whether there is any signal integrity problem in unset address bit(s) of the memory according to the comparison result of the current test data and the current read back data, in order to determine fault address bit(s). The method and system for testing a memory provided by the present invention may determine fault address bit(s) of the memory simply and quickly.

11 Claims, 6 Drawing Sheets

METHOD AND SYSTEM FOR TESTING A MEMORY

CROSS-REFERENCE TO RELATED APPLICATIONS

This application claims priority to Chinese Patent Application No. 201310372870.7, filed on Aug. 23, 2013, which is hereby incorporated by reference in its entirety.

FIELD OF INVENTION

The present invention relates generally to memory, and more particularly to method and system for testing a memory.

BACKGROUND

In the development process of Graphics Processing Unit (GPU) system, memory commissioning and qualification test is a key step for guaranteeing that memory design can meet the expected performance (i.e. running at Power-On Reset (POR) clock). During commissioning Synchronous Dynamic Random Access Memory (SDRAM), it is quite often to meet memory faults caused by transaction error on address bus. The reason is that there are too many loads on the address bus, so its signal integrity has been degraded. For example, as shown in FIG. 1, a CMD signal from GPU which includes an address signal may have up to 8 loads. The T branches introduce stubs and additional vias in Printed circuit board (PCB) layout which makes the signal integrity worse.

When the memory faults are investigated, it is more difficult to find out which address bit has error than to find out which data bit has error. In general, it is needed to test every address bit in the lab, and then to compare eye diagrams of all address bits to figure out the fault address bit(s). But due to no clear criterion to judge whether an eye diagram is good or bad, so it is difficult to confirm whether the suspected address bit is a fault address bit with a signal integrity problem. Currently the adopted confirmation way is to improve the layout of the suspected address bit and build a new hunch of PCB for verifying. Thus, this commissioning process is quite time consuming and not cost-efficient.

SUMMARY OF THE INVENTION

Accordingly, there is a need for providing a method for testing a memory to address the above problem of difficulty to confirm fault address bit(s) in address bit(s) of the memory.

In one embodiment, a method for testing a memory is disclosed. The method comprises the following steps. Each of at least one address bit to be tested of the memory is set to a fixed value. Current test data is written into memory unit(s) of the memory which the set address bit(s) correspond(s) to. Current read back data is read from the memory unit(s) which the set address bit(s) correspond(s) to. The current test data is compared with the current read back data. It is judged whether there is any signal integrity problem in unset address bit(s) of the memory according to the comparison result of the current test data and the current read back data, in order to determine fault address bit(s).

Preferably, the method further includes: before the setting each of at least one address bit to be tested of the memory to a fixed value, writing original test data into all memory units of the memory; reading original read back data from the written memory units; comparing the original test data with the original read back data; and after the judging whether there is any signal integrity problem in unset address bit(s) of the memory according to the comparison result of the current test data and the current read back data, judging whether there is any signal integrity problem in the at least one address bit to be tested according to the comparison result of the current test data and the current read back data and the comparison result of the original test data and the original read back data.

Preferably, the at least one address bit to be tested includes at least one previously tested address bit, and the method further includes: before the setting each of at least one address bit to be tested of the memory to a fixed value, setting each of the at least one previously tested address bit of the memory to a fixed value; writing previous test data into memory unit(s) of the memory which the previously tested address bit(s) being set correspond(s) to; reading previous read back data from the memory unit(s) which the previously tested address bit(s) being set correspond(s) to; comparing the previous test data with the previous read back data; and after the judging whether there is any signal integrity problem in unset address bit(s) of the memory according to the comparison result of the current test data and the current read back data, judging whether there is any signal integrity problem in the at least one address bit to be tested according to the comparison result of the current test data and the current read back data and the comparison result of the previous test data and the previous read back data.

Preferably, the current test data is included in reference data. The writing current test data into memory unit(s) of the memory which the set address bit(s) correspond(s) to includes: writing the reference data into the memory address by address starting from a head address of the memory. The comparing the current test data with the current read back data includes: regrouping the reference data according to the set address bit(s) to be tested to form regrouped data which is the same as the current test data, and comparing the regrouped data with the current write back data.

Preferably, the current test data is included in reference data. The method further includes: before the writing current test data into memory unit(s) of the memory which the set address bit(s) correspond(s) to, splitting the reference data according to the set address bit(s) to be tested, to obtain the current test data.

Preferably, the at least one address bit to be tested is selected in order.

Preferably, the at least one address bit to be tested is selected by dichotomy.

Preferably, the method further includes: before the setting each of at least one address bit to be tested of the memory to a fixed value, defining a register for each of all address bits. The register being used to represent three states: the address bit being not set to a fixed value, the address bit being set to 0 and the address bit being set to 1.

Preferably, the three states are physically determined by one or mare switches, each of which is composed of one or more transistors.

Preferably, the setting each of at least one address bit to be tested of the memory to a fixed value includes connecting an address line of each of the at least one address bit to be tested to the ground or power supply.

Preferably, the setting each of at least one address bit to be tested of the memory to a fixed value includes inputting logic low level or logic high level into an address line of each of the at least one address bit to be tested.

In another embodiment, a system for testing a memory is presented. The system comprises a setting module for setting each of at least one address bit to be tested of the memory to a fixed value. The system also comprises a writing module for writing current test data into memory unit(s) of the memory which the set address bit(s) correspond(s) to. The system also comprises a reading module for reading current read back data from the memory unit(s) which the set address bit(s) correspond(s) to. The system also comprises a comparison module for comparing the current test data with the current read back data. Finally, the system comprises a first judgment module for judging whether there is any signal integrity problem in unset address bit(s) of the memory according to the comparison result of the current test data and the current read back data in order to determine fault address bit(s).

Preferably, the system further includes: an original writing module for writing original test data into all memory units of the memory; an original reading module for reading original read back data from the written memory units; an original comparison module for comparing the original test data with the original read back data; and a second judgment module for judging whether there is any signal integrity problem in the at least one address bit to be tested according to the comparison result of the current test data and the current read back data and the comparison result of the original test data and the original read back data.

Preferably, the at least one address bit to be tested includes at least one previously tested address bit. The system further includes: a previous setting module for setting each of the at least one previously tested address bit of the memory to a fixed value; a previous writing module for writing previous test data into memory unit(s) of the memory which the previously tested address bit(s) being set correspond(s) to; a previous reading module for reading previous read back data from the memory unit(s) which the previously tested address bit(s) being set correspond(s) to; a previous comparison module for comparing the previous test data with the previous read hack data; and a third judgment module for judging whether there is any signal integrity problem in the at least one address bit to be tested according to the comparison result of the current test data and the current read back data and the comparison result of the previous test data and the previous read back data.

Preferably, the current test data is included in reference data. The writing module is further operable to write the reference data into the memory address by address starting from a head address of the memory. The comparison module is further operable to regroup the reference data according to the set address bit(s) to be tested to form regrouped data which is the same as the current test data, and compare the regrouped data with the current write back data.

Preferably, the current test data is included in reference data. The system further includes a splitting module for splitting the reference data according to the set address bit(s) to be tested, to obtain the current test data.

Preferably, the at least one address bit to be tested is selected in order.

Preferably, the at least one address bit to be tested is selected by dichotomy.

Preferably, the system further includes a definition module for defining a register for each of all address bits. The register being used to represent three states: the address bit being not set to a fixed value, the address bit being set to 0 and the address bit being set to 1.

Preferably, the three states are physically determined by one or more switches, each of which is composed of one or more transistors.

The system and method for testing a memory may determine fault address bit(s) of the memory simply and quickly. Compared with the prior art, the method of the present invention is more convenient, efficient and has low cost.

Advantages and features of the present invention will be described in detail below in connection with the accompanying drawings.

BRIEF DESCRIPTION OF THE DRAWINGS

In order that the advantages of the invention will be readily understood, a more detailed description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings.

DETAILED DESCRIPTION

In the following discussion, details are presented so as to provide a more thorough understanding of the present invention. However, the present invention may be implemented without one or more of these details as would be apparent to one of ordinary skill in the art. Certain examples are illustrated without elaborate discussion of technical features that would be within the purview of one of ordinary skill in the art so as to avoid confusion with the present invention.

Figure 1:
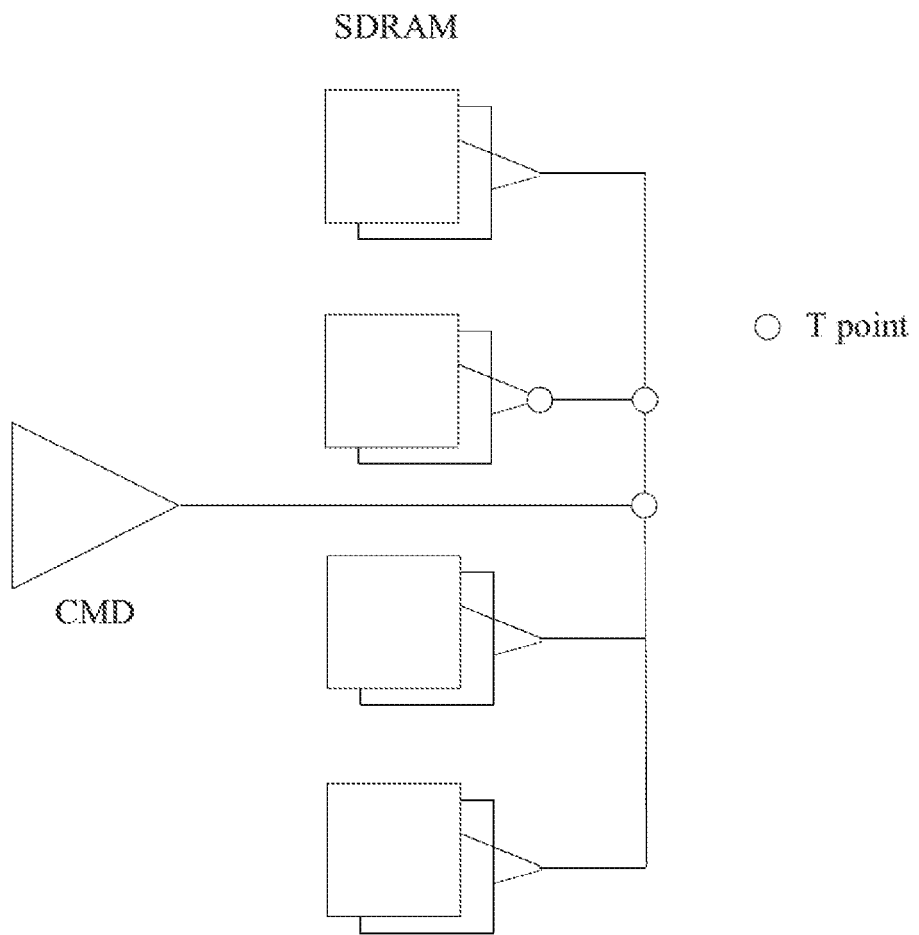
FIG. 1 illustrates an exemplary bus topology for SDRAM in the prior art.
Figure 2:
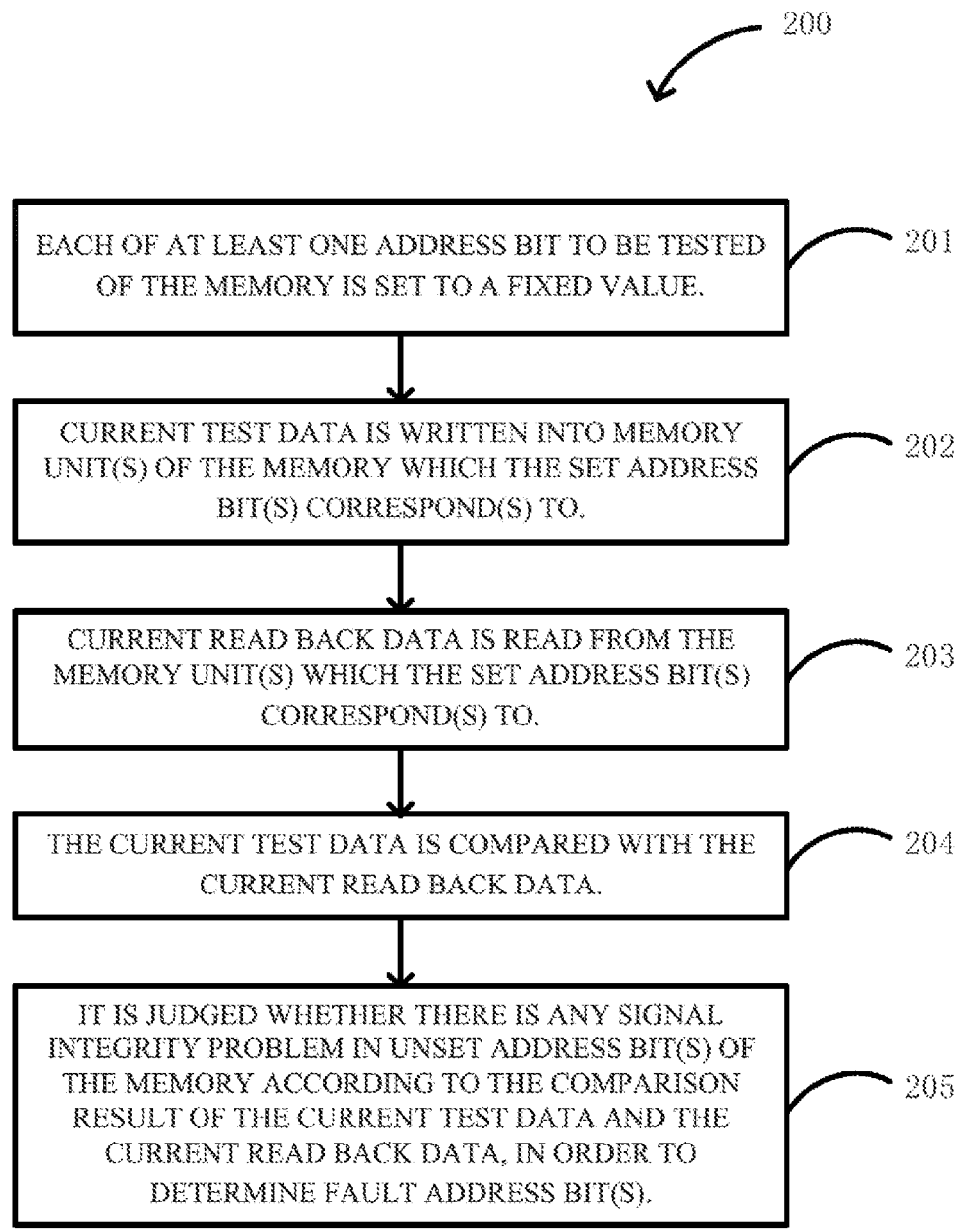
FIG. 2 illustrates a flow chart of a method for testing a memory, according to an embodiment of the present invention.

In an aspect of the present invention, a method for testing a memory is disclosed. FIG. 2 illustrates a flow chart of a method 200 for testing a memory, according to an embodiment of the present invention. The method will be described in combination with FIG. 2 below.

At step 201, each of at least one address bit to be tested of the memory is set to a fixed value. In embodiments of the present invention, the memory may be of any type. Preferably, the memory is an SDRAM. The memory has a plurality of address bits. The present invention excludes signal integrity problems caused by an address bit to be tested by fixing the address bit in high (VDD) or low (the ground) state. A fixed address bit may specify a certain memory unit within a memory for performing reading and writing operations on it. When the address bit to be tested is skipped, the number of memory units on which data reading and writing operations are performed is reduced. For example, the memory has 4 address bits: A0, A1, A2 and A3. The entire memory space which the four address bits A0, A1, A2 and A3 correspond to include 16 memory units. If only the address bit A1 is intended to be skipped, the address bit A1 may be set to a fixed value 0 (or 1). At this time, the addresses of the memory units which the set address bit A1 corresponds to include: 0000, 0001, 0100, 0101, 1000, 1001, 1100 and 1101. Thus, in this situation, the memory units to be tested are a half of the entire memory space (i.e. the number of the memory units to be tested is 8). Those skilled in the art will understand that the memory units to be tested are a quarter of the entire memory space when the skipped address bit A1 is used for both row and column addresses. However, the reduction of the memory space to be tested does not affect the confirmation of the address bit(s) with signal integrity problems. While testing whether an address bus or a data bus of the memory has any problem, test data may be written into all memory units of the memory under the control of a memory controller. Then the written data is read out under the control of the memory controller. The data read from the memory may be called read back data. If the test data is equal to the read back data, then there is no fault in the memory. If the test data is not equal to the read back data, then there is a fault in the memory. The memory fault includes data bit fault and address bit fault. If there are differences between fewer data bit/bits of the test data and the corresponding data bit/bits of the read back data, then it is usually indicated that there is a data bit fault. If there are differences between more data bits of the test data and the corresponding data bits of the read back data, then it is usually indicated that there is an address bit fault. When it is determined that there are signal integrity problems in address bits of the memory, the specific fault address bit(s) may be determined by using the method 200. The fixed value may be 0 or 1. The fixed value of each of the at least one address bit to be tested of the memory may be same or different with the other address bits to be tested. For example, the memory has 4 address bits: A0, A1, A2 and A3. When it is needed to determine whether there is any signal integrity problem in the address bits A0 and A1, both the address bits A0 and A1 may be set to fixed values. Both the address bits A0 and A1 being set to fixed values may include 4 setting modes: 00, 01, 10 and 11. One of the above four setting modes may be freely selected as needed.

At step 202, current test data is written into memory unit(s) of the memory which the set address bit(s) correspond(s) to. The current test data may be any suitable test data, for example, pattern data. A pattern may be written into memory unit(s) of the memory which the set address bit(s) correspond(s) to. Then the pattern is read out and compared with the original pattern. Using pattern data as the current test data is fairly intuitive and beneficial to judging the difference between the written data and the read data.

At step 203, Current read back data is read from the memory unit(s) which the set address bit(s) correspond(s) to. Data in the memory may be read out according to the address bit(s) being set. For example, if the memory has 4 address bits A0, A1, A2 and A3 and the address bit A1 is set to 0, then it is needed to read back data in the memory units with the following addresses: 0000, 0001, 0100, 0101, 1000, 1001, 1100 and 1101.

At step 204, the current test data is compared with the current read back data. In this step, a data error rate may be obtained according to the current test data and the current read back data.

At step 205, it is judged whether there is any signal integrity problem in unset address bit(s) of the memory according to the comparison result of the current test data and the current read back data, in order to determine fault address bit(s). The fault address bit refers to an address bit with signal integrity problems. If the current test data is equal to the current read back data, then there is no signal integrity problem in unset address bit(s) and there are integrity problems in the at least one address bit to be tested. A further test for the at least one address bit may continue with the steps of the method to judge which address bit(s) has (have) signal integrity problems. If the current test data is not equal to the current read back data, then there is(are) signal integrity problem(s) in unset address bit(s). A further test for the unset address bit(s) may continue with the steps of the method to judge which bit(s) has (have) signal integrity problems. Those skilled in the art can understand that the steps of the method 200 may be performed repeatedly as needed until determining all fault address bits of the memory. In addition, it will be understood that if only one address bit is not set to a fixed value and the other address bits are set to fixed values, then it may be determined that whether there is any signal integrity problem in the unset address bit. All fault address bits may be determined by not setting only one address bit of all address bits to a fixed value in turn.

In an embodiment, before setting each of at least one address bit to be tested of the memory to a fixed value, the method 200 may further include the following steps. Original test data is written into all memory units of the memory. Original read back data is read from the written memory units. The original test data is compared with the original read back data. After judging whether there is any signal integrity problem in unset address bit(s) of the memory according to the comparison result of the current test data and the current read back data, the method 200 may further include judging whether there is any signal integrity problem in the at least one address bit to be tested according to the comparison result of the current test data and the current read back data and the comparison result of the original test data and the original read back data. Before skipping the at least one address bit to be tested, a data error rate may be tested firstly for all address bits. For example, the memory has 4 address bits: A0, A1, A2 and A3. An original data error rate of the memory may be tested firstly in the case where no address bit is skipped. The original data error rate may be the comparison result of the original test data and the original read back data. Then the address bit A1 is skipped, that is, the address bit A1 is set to a fixed value (0 or 1). A current data error rate of the memory may be tested. The current data error rate may be the comparison result of the current test data and the current read back data. Then the original data error rate is compared with the current data error rate. If the current data error rate is equal to the original data error rate, then there is no signal integrity problem in the address bit A1 and there are signal integrity problems in the address bits A0, A2 and/or A3. If the current data error rate is less than the original data error rate and the current data error rate is equal to 0, then there is a signal integrity problem in the address bit A1 and there is no signal integrity problem in the address bits A0, A2 and/or A3. If the current data error rate is less than the original data error rate and the current data error rate is greater than 0, then there is a signal integrity problem in the address bit A1 and there are also signal integrity problems in the address bits A0, A2 and/or A3. If it is determined that there are signal integrity problems in the address bits A0, A2 and/or A3, it may be further determined that whether there is any signal integrity problem in each bit by using the same method as the address bit A1. That is, next whether there is any signal integrity problem in the address bit A2 may be tested. Only the address bit A2 may be set to a fixed value (0 or 1), and the data error rate may be tested. Then the data error rate when the address bit A2 is a fixed value may be compared with the original data error rate to determine whether there is any signal integrity problem in the address bit A2. It can be understood that the address bits to be tested may be a plurality of address bits. That is, the address bits A1 and A2 may be skipped at the same time to judge whether there is any signal integrity problem in the address bits A1 and A2. Then each of the address bits A1 and A2 is tested respectively. Those skilled in the art can understand that the number of the skipped bits may vary as needed and is not limited herein. Preferably, all address bits are tested using a way of skipping bit by bit to determine fault address bit(s). The test method of comparing with the original data error rate is simple and easy, and can determine fault address bit(s) quickly.

In one embodiment, the at least one address bit to be tested may include at least one previously tested address bit. Before setting each of at least one address bit to be tested of the memory to a fixed value, the method 200 may further include the following steps. Each of the at least one previously tested address bit of the memory is set to a fixed value. Previous test data is written into memory unit(s) of the memory which the previously tested address bit(s) being set correspond(s) to. Previous read back data is read from the memory unit(s) which the previously tested address bit(s) being set correspond(s) to. The previous test data is compared with the previous read back data. After judging whether there is any signal integrity problem in unset address bit(s) of the memory according to the comparison result of the current test data and the current read back data, the method 200 may further include judging whether there is any signal integrity problem in the at least one address bit to be tested according to the comparison result of the current test data and the current read back data and the comparison result of the previous test data and the previous read back data. For example, the memory has 4 address bits: A0, A1, A2 and A3. Assuming the address bit A1 is the previously tested address bit. The address bit A1 may be skipped firstly and a data error rate of the memory at this moment called previous data error rate herein may be tested. Then both the address bits A1 and A2 are skipped and a data error rate of the memory at this moment called current data error rate may be tested. The previous data error rate is compared with the current data error rate. If the current data error rate is equal to the previous data error rate, then there is no signal integrity problem in the address bit A2. If the current data error rate is less than the previous data error rate, then there is a signal integrity problem in the address bit A2. Those skilled in the art can understand that the other address bits may be tested in similar manner until determining all fault address bits and it will not be described in detail.

Figure 3:
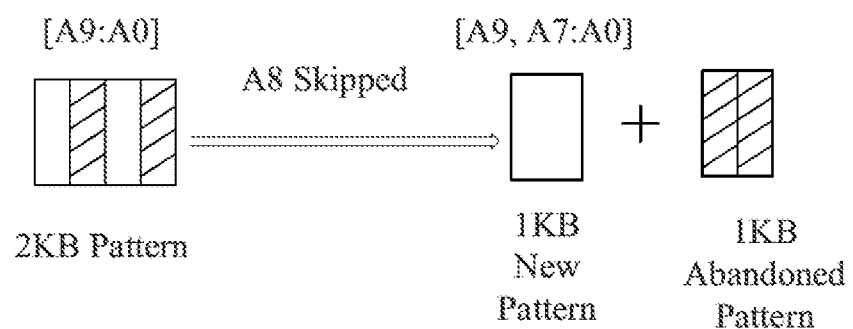
FIG. 3 illustrates an exemplary regrouping of reference data, according to an embodiment of the present invention.

In one embodiment, the current test data may be included in reference data. Writing current test data into memory unit(s) of the memory which the set address bit(s) correspond(s) to may include: writing the reference data into the memory, address by address, starting from a head address of the memory. The reference data may be written into a part or all of memory units of the memory as needed. For example, the reference data may be a complete pattern. Assuming the memory has 4 address bits A0, A1, A2 and A3 and there are 16 corresponding memory units. The pattern data may be divided into 16 equal parts. Each part of pattern data corresponds to one memory unit. Assuming the address bit A1 of the memory is set to a fixed value 0, the addresses of the memory units on which data reading and writing operations are actually performed include: 0000, 0001, 0100, 01.01, 1000, 1001, 1100 and 1101. The skipped addresses include: 0010, 0011, 0110, 0111, 1010, 1011, 1110 and 1111. Because eight addresses of memory units are skipped, the parts of data that should have been written into the eight memory units are not written. The current read back data read from the memory will be a half of the written reference data. Thus, in order to judge correctly whether the data reading and writing operations are correct, the reference data should be regrouped during comparison and data that is really written into the memory is compared with the current read back data. The comparison between the current test data and the current read back data includes: regrouping the reference data according to the set address bit(s) to be tested to form regrouped data which is the same as the current test data, and comparing the regrouped data with the current write back data. FIG. 3 illustrates an exemplary regrouping of the reference data, according to an embodiment of the present invention. In the example shown in FIG. 3, 2 KB pattern data, i.e. the reference data, is written into memory units with address bits A0-A9. Assuming the skipped address bit is the address bit A8, the entire pattern data may be divided into four equal parts. 1 KB data is discarded during writing and only 1 KB data is written into the memory. Thus, two parts of data that are really written into the memory may be regrouped into 1 KB regrouped data, and then the 1 KB regrouped data may be compared with the current read back data. The writing process can be simpler by using complete reference data to test the memory.

In one embodiment, the current test data may be included in reference data. Before the writing current test data into memory unit(s) of the memory which the set address bit(s) correspond(s) to, the method 200 may further include splitting the reference data according to the set address bit(s) to be tested, to obtain the current test data. For example, the reference data may be complete pattern data. Assuming the memory has 4 address bits A0, A1, A2 and A3 and there are 16 corresponding memory units. The pattern data may be divided into 16 equal parts. Each part of pattern data corresponds to one memory unit. Assuming the address bit A1 of the memory is set to a fixed value 0, the addresses of the memory units on which data reading and writing operations are actually performed include: 0000, 0001, 0100, 0101, 1000, 1001, 1100 and 1101. The skipped addresses include: 0010, 0011, 0110, 0111, 1010, 1011, 1110 and 1111. The pattern data may be split according to addresses of the memory units on which data reading and writing operations are actually performed before writing data into the memory. Then only the parts of data corresponding to the memory units on which data reading and writing operations are performed are written into the memory. Thus, during subsequent comparison process, the current test data may be directly compared with the current read back data without additional computation. The comparison process can be simpler by this way.

In one embodiment, at least one address bit to be tested may be selected in order. For example, the memory has 4 address bits. All bits may be set to fixed values in turn from the highest bit to the lowest bit. For example, each bit may be set to 0 respectively and test may be performed in turn for the addresses: 0xxx, x0xx, xx0x and xxx0, in which x represents that the address bit has not been set, i.e. it is not a fixed value. In this way, the signal integrity problem of each address bit may be tested in turn. Those skilled in the art will understand that the set process can be performed in arbitrary order, including but not limited to from highest bit to lowest bit, from lowest bit to highest bit, the order that the odd bits are set before the even bits, etc.

In one embodiment, the at least one address bit to be tested may be selected by dichotomy. For example, the memory has 4 address bits: A0, A1, A2 and A3. Firstly, data error rate is determined by performing reading and writing operations on the memory. Then lower two address bits A0 and A1 are set to fixed values. Reading and writing operations are performed on the memory and data error rate is determined again. If the data error rate changes to 0, then there are signal integrity problems in the address bits A0 and/or A1 and there is no signal integrity problem in the address bits A2 and/or A3. If the data error rate decreases but is not 0, then there are signal integrity problems both in the address bits A0 and/or A1 and the address bits A2 and/or A3. If the data error rate doesn't change, then there is no signal integrity problem in the address bits A0 and/or A1 and there are signal integrity problems in the address bits A2 and/or A3. Then, the two address bits with data integrity problems are further divided into a higher bit part and a lower bit part and respective parts are tested by the above way, and so on until determining all fault address bits. In the situation where the number of the fault address bits is fairly less, fault address bit(s) may be determined very quickly by using dichotomy.

In one embodiment, the method 200 may further include: before setting each of at least one address bit to be tested of the memory to a fixed value, defining a register for each of all address bits. The register is used to represent three states: the address bit being not set to a fixed value, the address bit being set to 0 and the address bit being set to 1. Table 1 illustrates definition modes of the register. As shown in Table 1, a two bits register ADDRESS_SKIP_CMD0 may be defined for each CMD0 (or any other) bit. The initialized value of the register is 0×0, which represents that the address bit is not set to a fixed value, that is, address skip mode is disenabled. The value of the register being 0×1 represents that address skip mode is enabled and the address bit is set to 0. The value of the register being 0×2 represents that address skip mode is enabled and the address bit is set to 1. The register may be predefined before performing memory test.

TABLE 1

| definition of the register | | |
|---|---|---|
| #define NV_PFB_ADDRESS_SKIP_CMD0 | 1:0 | /* RWIVF */ |
| #define NV_PFB_ADDRESS_SKIP_CMD0_INIT | 0x00000000 | /* RWI-V */ |
| #define NV_PFB_ADDRESS_SKIP_CMD0_LOW | 0x00000001 | /* RWI-V */ |
| #define NV_PFB_ADDRESS_SKIP_ CMD0_HIGH | 0x00000002 | /* RWI-V */ |

Figure 4A:
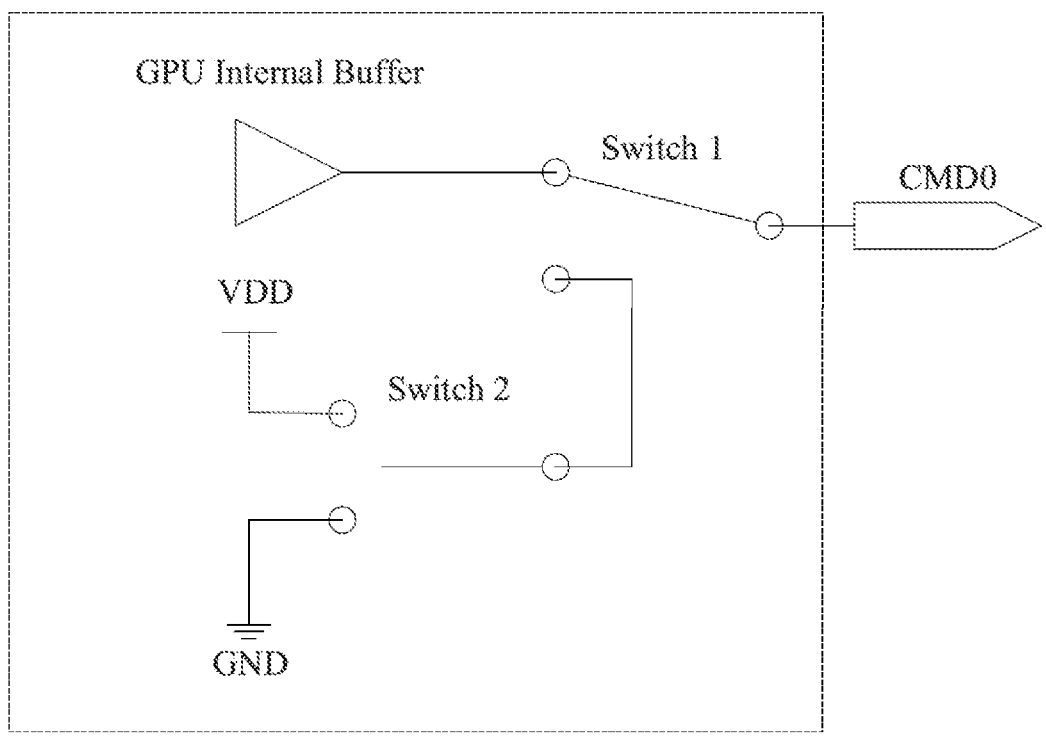
FIG. 4a illustrates a logical circuit diagram corresponding to a state in which the address bit is not set to a fixed value, according to an embodiment of the present invention.
Figure 4B:
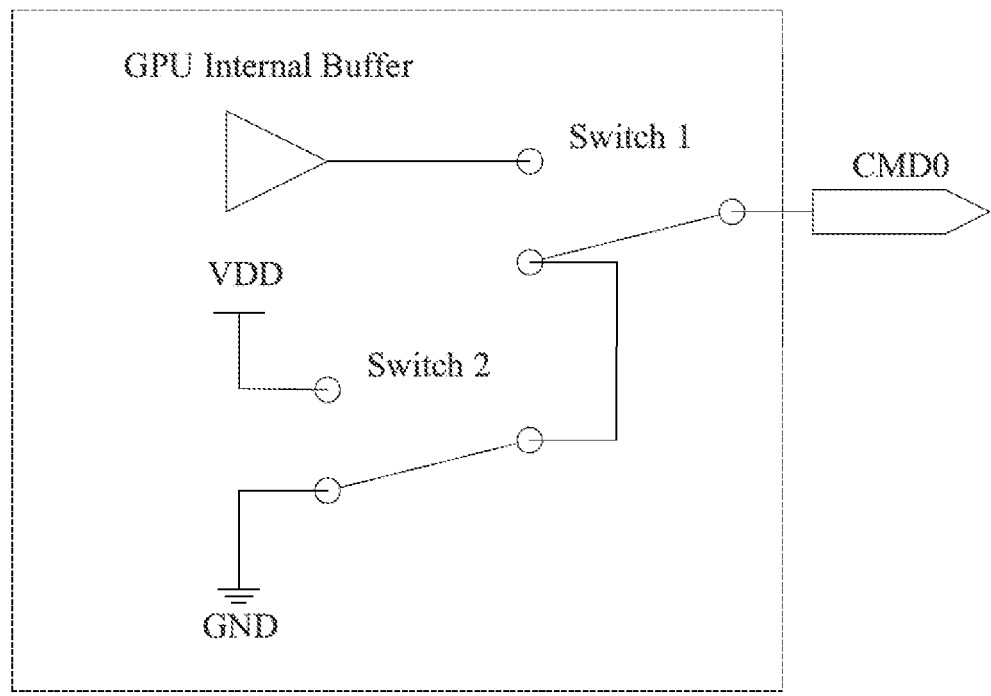
FIG. 4b illustrates a logical circuit diagram corresponding to a state in which the address bit is set to 0, according to an embodiment of the present invention.

In one embodiment, the three states may be physically determined by one or more switches, each of which may be composed of one or more transistors. FIG. 4a illustrates a logical circuit diagram corresponding to a state in which the address bit is not set to a fixed value, according to an embodiment of the present invention. FIG. 4b illustrates a logical circuit diagram corresponding to a state in which the address bit is set to 0, according to an embodiment of the present invention. As shown in FIG. 4a and FIG. 4b, the three states are determined by switch 1 and switch 2. Each of switch 1 and switch 2 may be composed of one or more transistors, for example, Complementary Metal-Oxide-Semiconductor Transistor (CMOS). Similar switches may be arranged for each address bit to control the state of the address bit for testing.

In one embodiment, the process of setting each of at least one address bit to be tested of the memory to a fixed value may include connecting an address line of each of the at least one address bit to be tested to the ground or power supply. Referring to FIG. 4a and FIG. 4b, when the address line is connected with the ground through the switch 2, the corresponding address bit is set to 0.

In one embodiment, the process of setting each of at least one address bit to be tested of the memory to a fixed value may include inputting logic low level or logic high level into an address line of each of the at least one address bit to be tested. The value of the address bit output to the memory may be directly set to 0 or 1 by a processor (for example, Central Processing Unit (CPU) or GPU). The above process can be realized by programming the processor, and thus it is simple to be implemented.

Though only the memory with 4 address bits has been discussed in the above embodiments, it can be understood that the number of address bits of the memory may be any suitable number.

According to the method for testing a memory in the present invention, the fault address bit(s) of the memory may be determined simply and quickly, and the efficiency and accuracy for testing memory are increased.

Figure 5:
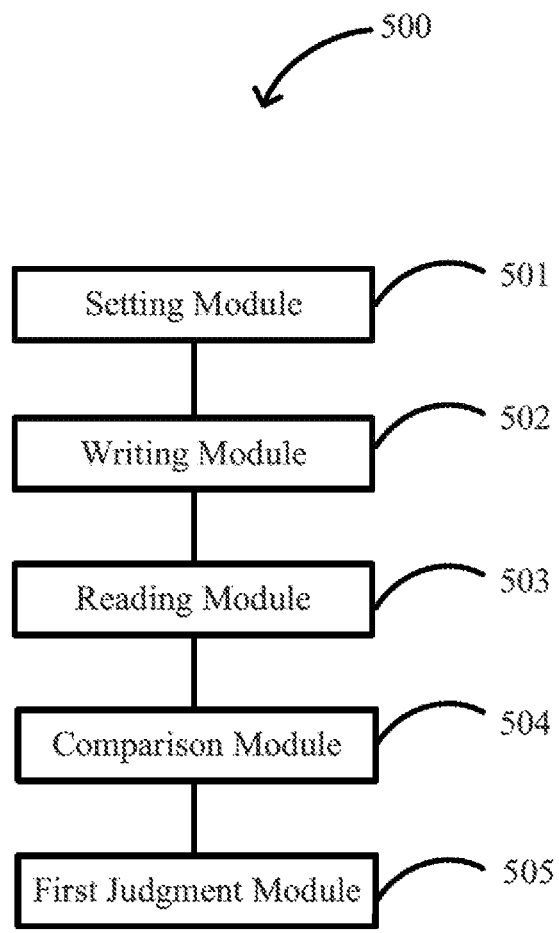
FIG. 5 illustrates a schematic block diagram of a system for testing a memory, according to an embodiment of the present invention.

In another aspect, a system for testing a memory is also disclosed. FIG. 5 illustrates a schematic block diagram of a system 500 for testing a memory, according to an embodiment of the present invention. The system 500 may include a setting module 501, a writing module 502, a reading module 503, a comparison module 504 and a first judgment module 505. The setting module 501 is operable to set each of at least one address bit to be tested of the memory to a fixed value. The writing module 502 is operable to write current test data into memory unit(s) of the memory which the set address bit(s) correspond(s) to. The reading module 503 is operable to read current read hack data from the memory unit(s) which the set address bit(s) correspond(s) to. The comparison module 504 is operable to compare the current test data with the current read back data. The first judgment module 505 is operable to judge whether there is any signal integrity problem in unset address bit(s) of the memory according to the comparison result of the current test data and the current read back data in order to determine fault address bit(s). The system 500 may be realized by a memory controller, for example, SDRAM controller. SDRAM controller may be used for controlling the reading and writing operations on SDRAM.

In one embodiment, the system 500 may further include an original writing module, an original reading module, an original comparison module and a second judgment module. The original writing module is operable to write original test data into all memory units of the memory. The original reading module is operable to read original read back data in the written memory units. The original comparison module is operable to compare the original test data with the original read back data. The second judgment module is operable to judge whether there is any signal integrity problem in the at least one address bit to be tested according to the comparison result of the current test data and the current read back data and the comparison result of the original test data and the original read back data.

In one embodiment, the at least one address bit to be tested may include at least one previously tested address bit. The system 500 may further include a previous setting module, a previous writing module, a previous reading module, a previous comparison module and a third judgment module. The previous setting module is operable to set each of the at least one previously tested address bit of the memory to a fixed value. The previous writing module is operable to write previous test data into memory unit(s) of the memory which the previously tested address bit(s) being set correspond(s) to. The previous reading module is operable to read previous read back data in the memory unit(s) which the previously tested address bit(s) being set correspond(s) to. The previous comparison module is operable to compare the previous test data with the previous read back data. The third judgment module is operable to judge whether there is any signal integrity problem in the at least one address bit to be tested according to the comparison result of the current test data and the current read back data and the comparison result of the previous test data and the previous read back data.

In one embodiment, the current test data may be included in reference data. The writing module may be further operable to write the reference data into the memory address by address starting from a head address of the memory. The comparison module may be further operable to regroup the reference data according to the set address bit(s) to be tested to form regrouped data which is the same as the current test data, and compare the regrouped data with the current write back data.

In one embodiment, the current test data may be included in reference data. The system 500 may further include a splitting module for splitting the reference data according to the set address bit(s) to be tested, to obtain the current test data.

In one embodiment, the at least one address bit to be tested may be selected in order.

In one embodiment, the at least one address bit to be tested may be selected by dichotomy.

In one embodiment, the system 500 may further include a definition module for defining a register for each of all address bits. The register is used to represent three states: the address bit being not set to a fixed value, the address bit being set to 0 and the address bit being set to 1.

In one embodiment, the three states may be physically determined by one or more switches, each of which is composed of one or more transistors.

Those skilled in the art can understand the operation mode of the system 500 with reference to FIG. 1-5 in combination with the above description about embodiments of the method for testing a memory. For brevity, a detailed description thereof is omitted.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

Embodiments according to the invention are thus described. While the present disclosure has been described in particular embodiments, it should be appreciated that the invention should not be construed as limited by such embodiments, but rather construed according to the below claims.

What is claimed is:

1. A method for testing a memory, comprising:
setting each of one or more set address bits to be tested of a memory to a fixed value;
writing current test data into one or more memory units of the memory which the one or more set address bits correspond to;
reading current read back data from the one or more memory units which the one or more set address bits correspond to;
comparing the current test data with the current read back data; and
judging whether there is any signal integrity problem in one or more unset address bits of the memory according to a result of the comparison of the current test data and the current read back data, in order to determine one or more fault address bits;
wherein the method further comprises:
before the setting each of the one or more set address bits to be tested of the memory to the fixed value,
writing original test data into a plurality of memory units of the memory;
reading original read back data from the written memory units;
comparing the original test data with the original read back data; and
after the judging whether there is any signal integrity problem in one or more unset address bits of the memory according to the result of the comparison of the current test data and the current read back data,
judging whether there is any signal integrity problem in the one or more set address bits to be tested according to the result of the comparison of the current test data and the current read back data and a result of the comparison of the original test data and the original read back data.

2. A method for testing a memory, comprising:
setting each of one or more set address bits to be tested of a memory to a fixed value;
writing current test data into one or more memory units of the memory which the one or more set address bits correspond to;
reading current read back data from the one or more memory units which the one or more set address bits correspond to;
comparing the current test data with the current read back data; and
judging whether there is any signal integrity problem in one or more unset address bits of the memory according to a result of the comparison of the current test data and the current read back data, in order to determine one or more fault address bits;
one or more set address bits to be tested includes at least one previously tested address bit, and the method further comprises:
before the setting each of the one or more set address bits to be tested of the memory to the fixed value,
setting each of the at least one previously tested address bit of the memory to a fixed value;
writing previous test data into one or more memory units of the memory which the one or more previously tested address bit(s) being set correspond to;
reading previous read back data from the one or more memory units which the one or more previously tested address bit(s) being set correspond to;
comparing the previous test data with the previous read back data; and
after the judging whether there is any signal integrity problem in one or more unset address bits of the memory according to the result of the comparison of the current test data and the current read back data,
judging whether there is any signal integrity problem in the one or more set address bits to be tested according to the result of the comparison of the current test data and the current read back data and a result of the comparison of the previous test data and the previous read back data.

3. A method for testing a memory, comprising:
setting each of one or more set address bits to be tested of a memory to a fixed value;
writing current test data into one or more memory units of the memory which the one or more set address bits correspond to;
reading current read back data from the one or more memory units which the one or more set address bits correspond to;

comparing the current test data with the current read back data; and judging whether there is any signal integrity problem in one or more unset address bits of the memory according to a result of the comparison of the current test data and the current read back data, in order to determine one or more fault address bits;

wherein the current test data is included in reference data, the writing current test data into one or more memory units of the memory which the one or more set address bits correspond to includes:

writing the reference data into a memory address by an address starting from a head address of the memory; and the comparing the current test data with the current read back data includes:

regrouping the reference data according to the one or more set address bits to be tested to form regrouped data which is the same as the current test data, and comparing the regrouped data.

4. A method for testing a memory, comprising:

setting each of one or more set address bits to be tested of a memory to a fixed value;

writing current test data into one or more memory units of the memory which the one or more set address bits correspond to;

reading current read back data from the one or more memory units which the one or more set address bits correspond to;

comparing the current test data with the current read back data; and judging whether there is any signal integrity problem in one or more unset address bits of the memory according to a result of the comparison of the current test data and the current read back data, in order to determine one or more fault address bits;

wherein the current test data is included in reference data, and the method further comprises:

before the writing current test data into one or more memory units of the memory which the one or more set address bits correspond to, splitting the reference data according to the one or more set address bits to be tested, to obtain the current test data.

5. The method according to claim 4, wherein the one or more set address bits to be tested is selected in order.

6. A method for testing a memory, comprising:

setting each of one or more set address bits to be tested of a memory to a fixed value;

writing current test data into one or more memory units of the memory which the one or more set address bits correspond to;

reading current read back data from the one or more memory units which the one or more set address bits correspond to;

comparing the current test data with the current read back data; and judging whether there is any signal integrity problem in one or more unset address bits of the memory according to a result of the comparison of the current test data and the current read back data, in order to determine one or more fault address bits;

wherein the one or more set address bits to be tested include a plurality of the set address bits selected by dichotomy.

7. A method for testing a memory, comprising:

setting each of one or more set address bits to be tested of a memory to a fixed value;

writing current test data into one or more memory units of the memory which the one or more set address bits correspond to;

reading current read back data from the one or more memory units which the one or more set address bits correspond to;

comparing the current test data with the current read back data; and judging whether there is any signal integrity problem in one or more unset address bits of the memory according to a result of the comparison of the current test data and the current read back data, in order to determine one or more fault address bits;

wherein the method further comprises:

before the setting each of the one or more set address bits to be tested of the memory to the fixed value, defining a register for each of a plurality of address bits, the register being used to represent three states: the address bit being not set to the fixed value, the address bit being set to 0 and the address bit being set to 1.

8. The method according to claim 7, wherein the three states are physically determined by one or more switches, each of which is composed of one or more transistors.

9. The method according to claim 7, wherein the setting each of the one or more set address bits to be tested of the memory to the fixed value includes connecting an address line of each of the one or more set address bits to be tested to a ground or power supply.

10. The method according to claim 7, wherein the setting each of the one or more set address bits to be tested of the memory to the fixed value includes inputting logic low level or logic high level into an address line of each of the one or more set address bits to be tested.

11. A system for testing a memory, comprising:

a setting module for setting each of one or more set address bits to be tested of a memory to a fixed value;

a writing module for writing current test data into one or more memory units of the memory which the one or more set address bits correspond to;

a reading module for reading current read back data from the one or more memory units which the one or more set address bits correspond to;

a comparison module for comparing the current test data with the current read back data; and a first judgment module for judging whether there is any signal integrity problem in one or more unset address bits of the memory according to a result of the comparison of the current test data and the current read back data in order to determine one or more fault address bits;

wherein the one or more set address bits to be tested include a plurality of the set address bits selected by dichotomy.

* * * * *